United States Patent
Djurdjic et al.

(10) Patent No.: US 10,743,406 B2
(45) Date of Patent: Aug. 11, 2020

(54) GALVANIC ISOLATION FOR ISOLATION TRANSFORMER

(71) Applicant: ABB Power Grids Switzerland AG, Baden (CH)

(72) Inventors: Andrija Djurdjic, Otelfingen (CH); Dominique Graber, Freienwil (CH)

(73) Assignee: ABB Power Grids Switzerland AG, Baden (CH)

(*) Notice: Subject to any disclaimer, the term of this patent is extended or adjusted under 35 U.S.C. 154(b) by 0 days.

(21) Appl. No.: 16/246,722

(22) Filed: Jan. 14, 2019

(65) Prior Publication Data
US 2019/0150274 A1 May 16, 2019

Related U.S. Application Data

(63) Continuation of application No. PCT/EP2017/067558, filed on Jul. 12, 2017.

(30) Foreign Application Priority Data

Jul. 12, 2016 (EP) .................................. 16179095

(51) Int. Cl.
*H05K 1/02* (2006.01)
*H05K 1/18* (2006.01)
(Continued)

(52) U.S. Cl.
CPC ....... *H05K 1/0256* (2013.01); *H01F 27/2828* (2013.01); *H01F 27/292* (2013.01);
(Continued)

(58) Field of Classification Search
CPC .. H05K 1/02; H05K 1/18; H01F 17/04; H01F 27/02; H01F 27/06; H01F 27/29; H01F 27/30; H01F 27/32
(Continued)

(56) References Cited

U.S. PATENT DOCUMENTS 5,696,477 A * 12/1997 Yamamori ............ H01F 27/027
336/185
6,563,056 B1 * 5/2003 Belwon ................ H05K 1/0256
174/260
(Continued)

FOREIGN PATENT DOCUMENTS

DE       1054515 B      4/1959
DE    102013113861 A1   6/2015
EP       1971193 A1     9/2008

OTHER PUBLICATIONS

European Patent Office, International Search Report & Written Opinion issued in corresponding Application No. PCT/EP2017/067558, dated Oct. 19, 2017, 12 pages.
(Continued)

*Primary Examiner* — Xiaoliang Chen
(74) *Attorney, Agent, or Firm* — Slater Matsil, LLP

(57) ABSTRACT

The application relates to a galvanic separating apparatus, including a printed circuit board, the printed circuit board including a first soldering pad, a second soldering pad and a recess, whereby the pads are arranged on a lower side of the printed circuit board thereby defining a clearance and/or creepage distance between the pads, and the recess is arranged between the pads, a primary insulated winding layer connected to the first soldering pad and a second insulated winding layer connected to the second soldering part, whereby the winding layers are arranged on an upper side of the printed circuit board, and an insulating layer, whereby the insulating layer extends from the upper side through the recess and protrudes on the lower side beyond the printed circuit board thereby increasing the clearance and/or creepage distance.

23 Claims, 3 Drawing Sheets

(51) Int. Cl.
*H01F 17/02* (2006.01)
*H01F 17/06* (2006.01)
*H01F 27/28* (2006.01)
*H01F 27/29* (2006.01)
*H01F 27/32* (2006.01)
*H05K 1/11* (2006.01)
*H05K 1/14* (2006.01)
*H05K 3/36* (2006.01)

(52) U.S. Cl.
CPC ........... *H01F 27/32* (2013.01); *H01F 27/324* (2013.01); *H05K 1/0259* (2013.01); *H05K 1/11* (2013.01); *H05K 1/184* (2013.01); *H01F 2027/297* (2013.01); *H05K 1/141* (2013.01); *H05K 1/18* (2013.01); *H05K 1/181* (2013.01); *H05K 3/366* (2013.01); *H05K 2201/048* (2013.01); *H05K 2201/0746* (2013.01); *H05K 2201/09072* (2013.01); *H05K 2201/1003* (2013.01)

(58) Field of Classification Search
USPC .......... 174/260; 336/65, 177, 185, 192, 198, 336/208, 221, 803; 361/221
See application file for complete search history.

(56) References Cited

U.S. PATENT DOCUMENTS

| | | | | |
|---|---|---|---|---|
| 7,724,115 | B2* | 5/2010 | Chen | H01F 27/326 336/131 |
| 7,830,234 | B1* | 11/2010 | Tien | H01F 27/326 336/192 |
| 2009/0278646 | A1* | 11/2009 | Chen | H01F 27/325 336/177 |
| 2010/0214053 | A1* | 8/2010 | Chen | H01F 27/325 336/221 |
| 2011/0193668 | A1* | 8/2011 | Park | H01F 27/06 336/65 |
| 2012/0002387 | A1* | 1/2012 | Park | H01F 27/325 361/760 |
| 2014/0048322 | A1* | 2/2014 | Chen | H05K 1/181 174/260 |

OTHER PUBLICATIONS

European Patent Office, Extended Search Report issued in corresponding Application No. 16179095.1, dated Jan. 24, 2017, 7 pages.

* cited by examiner

GALVANIC ISOLATION FOR ISOLATION TRANSFORMER

TECHNICAL FIELD

The invention relates to a galvanic separating apparatus, comprising a printed circuit board, the printed circuit board comprising a first soldering pad and a second soldering pad, whereby the pads are arranged on a lower side of the printed circuit board thereby defining a clearance distance and/or creepage distance between the pads.

BACKGROUND ART

In substation automation it is essential to reach highest possible reliability and availability, which is a challenge for every designer of such installations. Several contradictory aspects need to be implemented in the same design, as, among others, I/O circuits need to be galvanic insulated for elimination of ground loops or double insulation needs to be implemented. While high reliability and high availability are desired, the respective I/O circuits need to be protected against EMC, which leads to an increase in the amount of needed components. While the designer decides, where the galvanic isolation takes place in such installations, usually the galvanic isolation is implemented between external interface and internal electronics. Product safety standard IEC 60255-27 defines categories for interfaces in several circuit classes such as HLV, PELV etc., thus resulting in various possible combinations for decoupling between classes such as HLV to PELV, PELV to PELV, HLV to HLV etc.

For example, for HLV to PELV with IEC 60255-27 as product standard, a rated insulation voltage of 300V AC/DC, reinforced insulation, overvoltage category III and pollution degree II, and electro static discharge (ESD) according to IEC 60255-26; IEC 61000-4-2; IEEE Std C37.90.3 with an air discharge of 15 kV and contact discharge of 8 KV, required clearance and creepage distances for galvanic isolations are designed to withstand surge and high voltage AC/DC tests according to required overvoltage category. In general, the rated impulse voltage (RIMV) is smaller than the air discharge voltage to be applied for ESD (RIMV 4 kV≤ESDair=15 kV). Classical thumb of rule for clearance distances is 1 kV/mm with required ESD clearance 15 mm i.e. according to IEC 60255-27 5.5 mm (reinforced).

However, it is obvious that the specified clearance and creepage distances according to IEC 60255-27 cannot withstand high voltage transient such as ESD pulses and flash-over may occur. Due to the injected transients a current flows through the galvanic isolation, occurred by a charge respectively discharge current of coupling capacity. This current causes often interferences with electronics on the secondary as well as on primary side of such galvanic isolation apparatus, for example of an isolation transformer. The measures know from prior art to avoid said transients such as, for example, adding protection circuits to limit maximum over voltage and/or to limit maximum current flowing into electronics or adding coating or potting, in a disadvantageous manner increase the required space and increase manufacturing and thus device costs.

US 2014/048322 A1 describes an electronic apparatus comprising a circuit board, an insulation structure and a transformer. The circuit board has a top surface, a bottom surface and an opening extending across the top surface and the bottom surface.

U.S. Pat. No. 6,563,056 B1 describes a printed circuit board (PCB) assembly which comprises at least two separate PCB sections, whereby an insulation transformer is used as a support structure to mechanically interconnect the sections.

DE 10 2013 113861 A describes a galvanic separating device which is simple to produce as a planar transformer and simple to equip and which can be soldered onto a circuit board together with other components on the circuit board.

SUMMARY OF INVENTION

It is therefore an object of the invention to provide a galvanic separating apparatus which can withstand high voltage transients.

The object of the invention is solved by the features of the independent claim. Preferred embodiments are detailed in the dependent claims.

Thus, the object is solved by a galvanic separating apparatus, comprising a printed circuit board, the printed circuit board comprising a first soldering pad, a second soldering pad and a recess, whereby the pads are arranged on a lower side of the printed circuit board thereby defining a clearance distance and/or creepage distance between the pads, and the recess is arranged between the pads, a primary insulated winding layer connected to the first soldering pad and a second insulated winding layer connected to the second soldering part, whereby the winding layers are arranged on an upper side of the printed circuit board, and an insulating layer, whereby the insulating layer extends from the upper side through the recess and protrudes on the lower side beyond the printed circuit board thereby increasing the clearance and/or creepage distance.

A key point of the invention resides in furnishing the galvanic separating apparatus with the insulating layer for increasing the clearance and/or creepage distance. The proposed solution has the advantage that no flash-over occurs if high voltage transients are injected, which leads to a reduction of interference between injected transient and electronics. In prior art installations, required clearance and/or creepage distances between reference potentials often could not be implemented due to missing space on printed circuit boards. With the proposed solution prior art potting or coating for withstanding high voltage transients becomes obsolete and no costly overvoltage protection is required anymore. Thus, the proposed solution allows for higher MTBF values, higher reliability and availability due to less probability of earth faults due to failing components at cheap manufacturing costs. In addition, a higher integration of I/O channels with smaller galvanic isolation and more I/O channels per device can be implemented. In other words, the invention provides a relaxation of otherwise required and more costly internal measures to withstand high voltage transients.

Preferably, the winding layers are soldered on the printed circuit board to the pads. The recess is preferably arranged centered between the pads. The recess preferably comprises a rectangular shape with rounded edges and/or is dimensioned greater than the insulating layer such that the insulating layer, when arranged in the recess, does not contact the printed circuit board. For example the recess comprises a width that is three times the width of the insulating layer. The insulating layer is preferably provided as a flat plate, shielding wall, blade or the like and comprises an electrically insulating material. A primary side of the galvanic separating apparatus is preferably connected to the primary insulated winding layer and a secondary side of the galvanic separating apparatus is preferably connected to the secondary insulated winding layer. The primary insulated winding layer respectively the primary side is preferably connected to hazardous live voltage (HLV) and the secondary insulated winding layer respectively the secondary side is preferably connected to protective extra low voltage (PELV). Other configurations, for example with the classes as per IEC 60255-27, as possible as well. The insulated winding layer preferably comprises multiple windings each insulated from each other. Thus, the winding layers respectively the galvanic isolation apparatus are preferably provided as an isolation transformer. Preferably, the galvanic isolation apparatus is adapted for use in substation automation.

According to a preferred embodiment, the insulating layer is arranged in between and thereby insulating the winding layers from each other and protrudes beyond the winding layers. Such embodiment results in an advantageous smaller coupling capacity between primary to secondary side, thus reducing impact of high voltage fast transients to secondary side. Preferably, the winding layers are arranged abutting to the insulating layer. Further preferably the insulating layer matches in its extension at least the extension of the winding layers.

According to another preferred embodiment, the insulating layer comprises an insulation plate which extends parallel to the printed circuit board and perpendicular to the insulating layer, and is arranged between the printed circuit board and the winding layers. The insulation plate is preferably integrally formed with the insulating layer, comprises preferably the same material and/or the insulating layer with the insulation plate comprise in side view, a 'T'-shape. More preferably the insulation plate is arranged abutting to the printed circuit board and/or comprises, in a direction parallel to the printed circuit board, the same or at least the same extension than the windings. In longitudinal extension direction of the recess and parallel to the printed circuit board, the insulation plate preferably protrudes the windings and/or is smaller than the recess.

According to a further preferred embodiment, the insulating layer extends at least partly perpendicular to the printed circuit board. In an especially preferred embodiment, the insulating layer extends perpendicular to the printed circuit board by protruding the winding layers in all directions and protrudes through the recess beyond the printed circuit board.

According to another preferred embodiment, the galvanic separating apparatus comprises a second insulation layer which extends parallel to the printed circuit board and is arranged in between and thereby insulating the winding layers from each other. The second insulation layer preferably comprises the shape of a tube, is arranged abutting to the windings layers and/or comprises the same material as the insulating layer. In an especially preferred embodiment the second insulation layer is provided together with the insulating layer and insulation plate provided as 'T'-shape. Due to the second insulation layer a two-section bobbin otherwise required can be advantageously omitted.

According to a further preferred embodiment, the primary winding layer and/or the secondary winding layer comprise helical conductor paths, the conductor paths are insulated from each other by potting, coating and/or comprise a triple isolation according to IEC 60950. A rod of the winding layers preferably extends parallel to the printed circuit board. The helical conductor paths are preferably arranged on the rod extending in a direction parallel to the printed circuit board. Preferably, the winding layers comprise multiple windings and/or bifilar windings.

According to another preferred embodiment, the primary winding layer and/or the secondary winding layer comprises a THT, through hole technology, or SMT, surface mount technology, bobbin, for example a THT EP 10 core, on which the windings are arranged. The bobbin is preferably soldered on the upper side onto the printed circuit board, for example by wave soldering.

According to a further preferred embodiment, the first soldering pad and/or the second soldering pad comprises a THT pin. The winding layers are preferably wave soldered on the upper side onto the printed circuit board and electrically through contacted, for example by said THT pin, to the lower side of the printed circuit board. Using such through hole technology allows for a cost effective manufacturing.

According to another preferred embodiment, the insulating layer is removable fixed to the winding layers. Such way the insulating layer can be advantageously removed, exchanged or added to the winding layers.

According to a further preferred embodiment, the insulating layer comprises a thickness of 1 mm or 2 mm. The thickness of the insulating layer between the primary winding layer and the secondary winding layer can be designed to limit the maximum coupling capacity. For example, a greater thickness results in a smaller coupling capacity, while vice versa a smaller thickness results in a greater coupling capacity. Reducing the coupling capacity between primary and secondary side leads to a reduction of interference between injected transient and electronics as well as to a reduction of amount of otherwise required protection measures, thereby resulting in smaller packages, less (peak) power dissipation etc. Alternatively, the thickness of the insulating layer can be $\geq 0.5$ mm, $\geq 3$ mm or $\geq 5$ mm and/or $\leq 2$ mm, $\leq 3$ mm or $\leq 5$ mm.

According to another preferred embodiment, a distance between the pads on the lower side of the printed circuit board is $\geq 3$ mm, $\geq 5.5$ mm or $\geq 11$ mm. The distance is the direct distance between the pads at unhindered dispersion, for example measured when the insulating layer is removed from the recess. Preferably, the distance fulfils the requirements of IEC 60255-27, for example 5.5 mm for 300 V AC/DC rated insulation voltage and material group II as per table C.10 of IEC 60255-27. Alternatively, the distance might be 1.7 mm, 3 mm or 14 mm.

According to a further preferred embodiment, the clearance and/or creepage distance is $\geq 1.2$, 1.5, 2 or 2.5 times the distance. Preferably both the clearance and creepage distances fulfil said condition for withstanding high voltage transients.

According to another preferred embodiment, the insulating layer protrudes beyond the winding layers in a direction parallel to and/or away from the printed circuit board. According to a further preferred embodiment, the insulating layer protrudes on the lower side beyond the printed circuit board $\geq 0.25$, 0.5 or 1 times the distance. By protruding beyond the printed circuit board the insulating layer advantageously increases the clearance and/or creepage distance.

BRIEF DESCRIPTION OF DRAWINGS

These and other aspects of the invention will be apparent from and elucidated with reference to the embodiments described hereinafter.

In the drawings.

DESCRIPTION OF EMBODIMENTS

Figure 1:
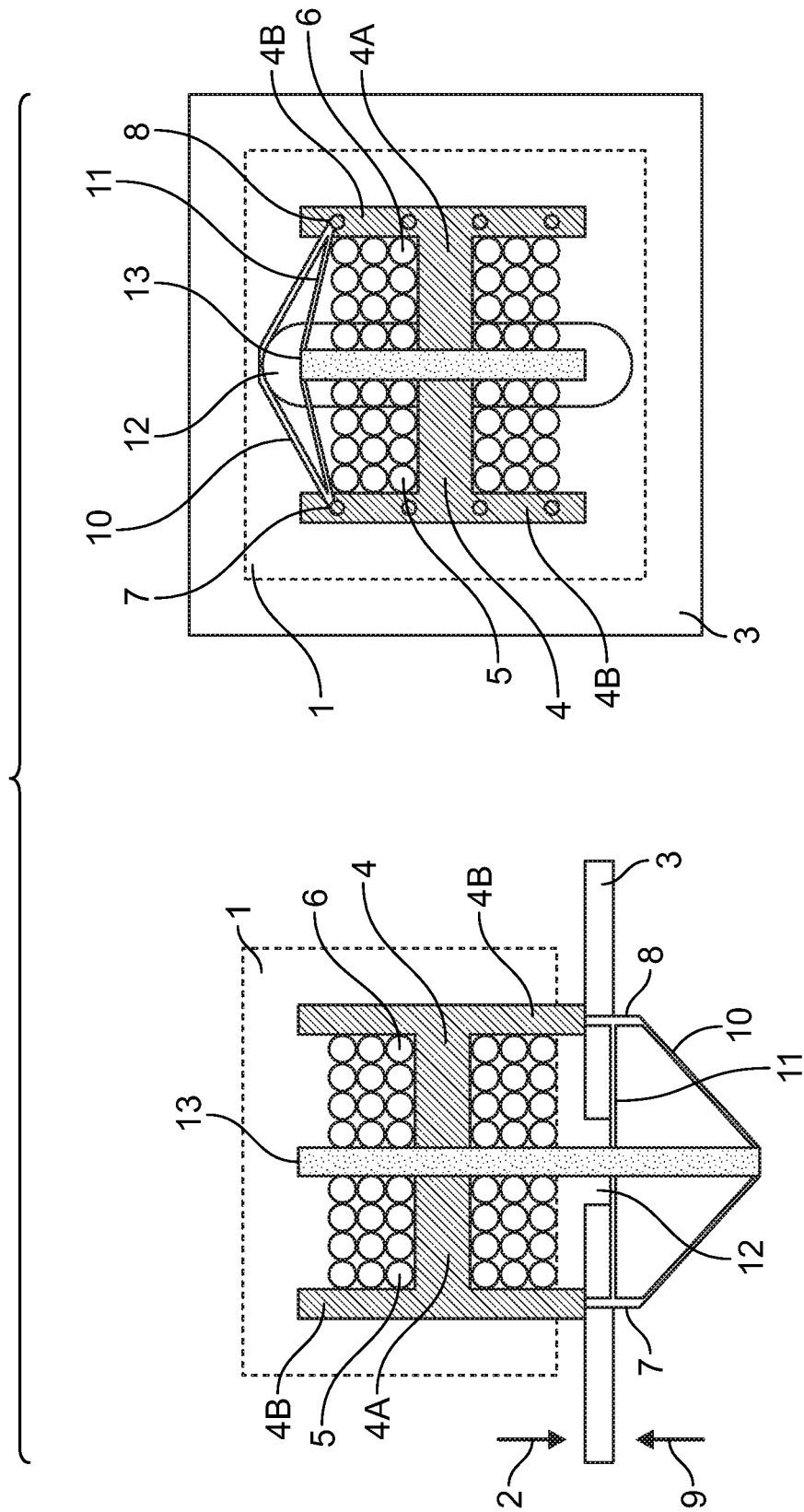
FIG. 1 shows a galvanic separating apparatus in a side view on the left side and a top view on the right side according to a first preferred embodiment.
Figure 2:
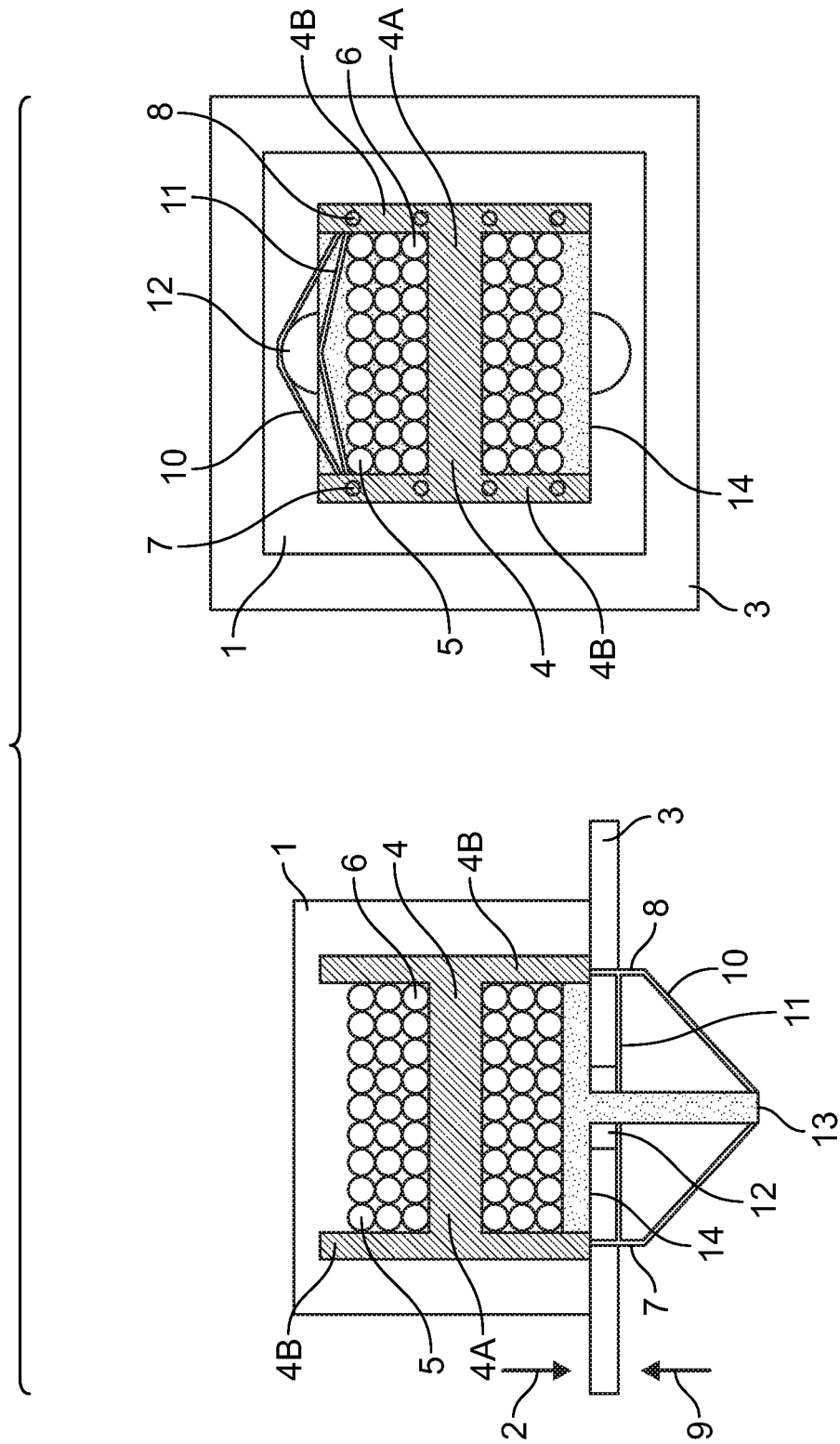
FIG. 2 shows the galvanic separating apparatus in a side view on the left side and a top view on the right side according to a second preferred embodiment.
Figure 3:
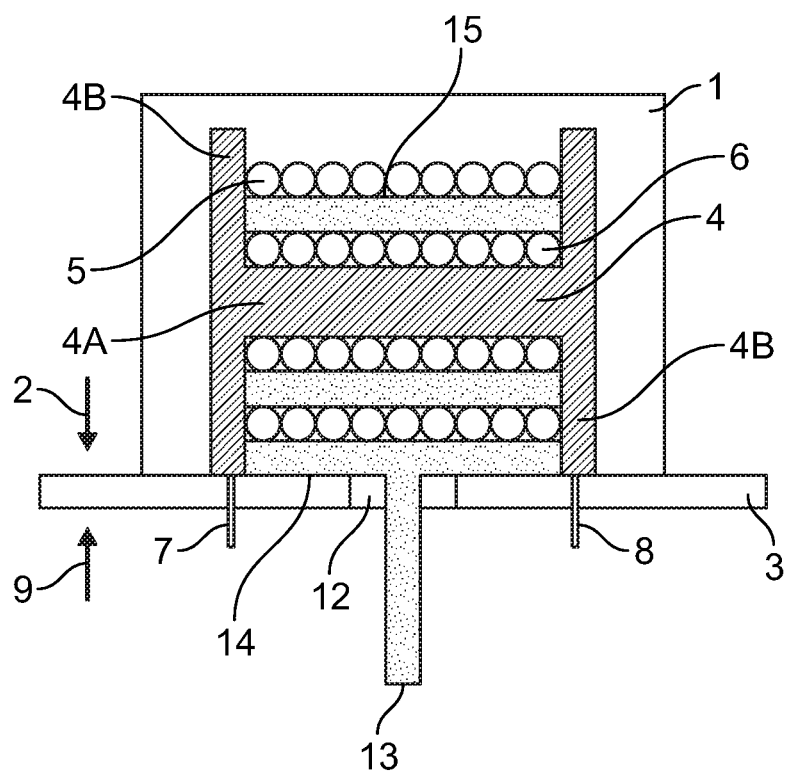
FIG. 3 shows the galvanic separating apparatus in a side view according to a third preferred embodiment.

FIGS. 1 to 2 each show a galvanic separating apparatus in a side view and top view according to different preferred embodiments, while FIG. 3 shows the galvanic separating apparatus in a side view. The galvanic separating apparatus comprises an isolation transformer 1 soldered onto an upper side 2 of a printed circuit board 3. The isolation transformer 1 comprises a THT bobbin 4, in particular a THT EP 10 core. As shown, the bobbin 4 includes an axle 4A about which the winding layers 5, 6 are wound and a pair of flanges 4B enclosing the winding layers 5, 6. While not shown, alternatively a SMD bobbin 4 could be used as well. The THT bobbin 4 can be wave soldered or electrically connected by using a "paste in hole" technology to the printed circuit board 3. A primary insulated winding layer 5 and a secondary insulated winding layer 6 are arranged on the THT bobbin 4. The winding of the primary insulated winding layer 5 and of the secondary insulated winding layer 6 each comprise helical conductor paths having a triple isolation according to IEC 60950. Alternatively, the conductor paths can be insulated from each other by potting and/or coating, or may comprise bifilar winding.

The printed circuit board 3 comprises a first soldering pad 7 and a second soldering pad 8, which are both arranged on a lower side 9 of the printed circuit board 3. A THT pin is soldered to first soldering pad 7 on the lower side 9 and to the primary insulated winding layer 5 on the upper side 2, and another THT pin is soldered to the second soldering pad 8 on the lower side 9 and to the secondary insulated winding layer 6 on the upper side 2. Thereby, the pads 7, 8 define a clearance distance 10 and a creepage distance 11 between them. The direct distance between the pads 7, 8 is 5.5 mm.

The printed circuit board 3 further comprises a recess 12 extending from the upper side 2 to the lower side 9 and being arranged between the pads 7, 8. An insulating layer 13 is arranged perpendicular to the printed circuit board 3 in between and thereby insulating the winding layers 5, 6 from each other on the upper side 2 and protrudes, both perpendicular and parallel to the printed circuit board 3, beyond the winding layers 5, 6. The insulating layer 13 extends, from the upper side 2, through the recess 12 and protrudes on the lower side 9 beyond the printed circuit board 3 by around 3 mm thereby increasing the clearance and creepage distances 10, 11. Thus, the clearance and creepage distances 10, 11 are greater than 1.5 times the distance. The insulating layer 13 is removable fixed to the winding layers 5, 6 i.e. can be removed from the isolation transformer 2. The insulating layer comprises a thickness of 1 mm or 2 mm and an electrically insulating material.

FIG. 2 shows a further embodiment, whereby the insulating layer 13 is not arranged in between the winding layers 5, 6 as a separator, while still extending from the upper side 2 through the recess 12 and protruding on the lower side 9 beyond the printed circuit board 3 for increasing the clearance and creepage distances 10, 11. The insulating layer 13 extending perpendicular to the printed circuit board 3 further comprises an insulation plate 14, which extends parallel to the printed circuit board 3 and perpendicular to the insulating layer 13. The insulation plate 14 is arranged between the printed circuit board 3 and the winding layers 4, 6 as a flat plate integrally formed with the perpendicular thereto, through the recess 12 extending insulating layer 13. The insulating layer 13 with insulation plate 14 are formed, in a side view, as a "T". The insulation plate 14 and the insulating layer 13 comprise the same thickness, whereby the insulation plate 14 has the same extension than the winding layers 5, 6 in extension parallel to the printed circuit board 3. In longitudinal extension of the recess, as can be seen from the top view in FIG. 2, the insulation plate 14 protrudes the winding layers 5, 6 on both sides. Besides that the embodiment shown in FIG. 2 equals the embodiment shown in FIG. 1.

FIG. 3 shows the galvanic separating apparatus in a side view according to a third preferred embodiment, again having the integrally formed insulating layer 13 with insulation plate 14 extending perpendicular thereto. In addition, a second insulation layer 15 is provided, which extends parallel to the printed circuit board 3 and is arranged in between and thereby insulating the winding layers 5, 6 from each other. The second insulation layer 15 comprises the same thickness as the insulation layer 13 and extends across the whole width of the winding layers 5, 6 in the shape of a tube, as can be seen in FIG. 3. Besides that the embodiment shown in FIG. 3 equals the embodiment shown in FIG. 2.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

REFERENCE SIGNS LIST 1 isolation transformer
2 upper side
3 printed circuit board
4 bobbin
5 primary insulated winding layer
6 secondary insulated winding layer
7 first soldering pad
8 second soldering pad
9 lower side
10 clearance distance
11 creepage distance
12 recess
13 insulating layer
14 insulation plate
15 second insulation layer

The invention claimed is:
1. A galvanic separating apparatus, comprising
a printed circuit board, the printed circuit board comprising a first soldering pad, a second soldering pad and a recess, whereby the pads are arranged on a lower side of the printed circuit board thereby defining a clearance and/or creepage distance between the pads, and the recess is arranged between the pads, a bobbin arranged on an upper side of the printed circuit board, the bobbin comprising an axle and a pair of flanges, a primary insulated winding layer connected to the first soldering pad and a second insulated winding layer connected to the second soldering part, whereby the winding layers are arranged on the upper side of the printed circuit board and are wound about the axle of the bobbin within the pair of flanges, and an insulating layer, whereby the insulating layer extends from the upper side through the recess and protrudes on the lower side beyond the printed circuit board thereby increasing the clearance and/or creepage distance, whereby a portion of the insulating layer is arranged within the bobbin between the pair of flanges, and the clearance and/or creepage distance is ≥1.2 a distance between the pads on the lower side of the printed circuit board.

2. The galvanic separating apparatus according to claim 1, whereby the insulating layer comprises an insulation plate which extends parallel to the printed circuit board and perpendicular to the insulating layer, and is arranged between the printed circuit board and the winding layers.

3. The galvanic separating apparatus according to claim 1, whereby the insulating layer extends at least partly perpendicular to the printed circuit board.

4. The galvanic separating apparatus according to claim 1, comprising a second insulation layer which extends parallel to the printed circuit board and is arranged in between and thereby insulating the winding layers from each other.

5. The galvanic separating apparatus according to claim 1, whereby the conductor paths are insulated from each other by potting.

6. The galvanic separating apparatus according to claim 1, whereby the primary winding layer and/or the secondary winding layer comprises a THT or SMT bobbin.

7. The galvanic separating apparatus according to claim 1, whereby the first soldering pad and/or the second soldering pad comprises a THT pin.

8. The galvanic separating apparatus according to claim 1, whereby the insulating layer is removable fixed to the winding layers.

9. The galvanic separating apparatus according to claim 1, whereby the insulating layer comprises a thickness of 1 mm.

10. The galvanic separating apparatus according to claim 1, whereby the distance between the pads on the lower side of the printed circuit board is ≥3 mm.

11. The galvanic separating apparatus according to claim 1, whereby the clearance and/or creepage distance is 1.5 times the distance.

12. The galvanic separating apparatus according to claim 1, whereby the insulating layer protrudes on the lower side beyond the printed circuit board ≥0.25 times of the distance.

13. The galvanic separating apparatus according to claim 1, whereby the insulating layer protrudes beyond the winding layers in a direction parallel to and/or away from the printed circuit board.

14. The galvanic separating apparatus according to claim 2, whereby the insulating layer extends at least partly perpendicular to the printed circuit board.

15. The galvanic separating apparatus according to claim 14, comprising a second insulation layer which extends parallel to the printed circuit board and is arranged in between and thereby insulating the winding layers from each other.

16. The galvanic separating apparatus according to claim 1, whereby the insulating layer comprises a thickness of ≥2 mm.

17. The galvanic separating apparatus according to claim 1, whereby the distance between the pads on the lower side of the printed circuit board is ≥5.5 mm.

18. The galvanic separating apparatus according to claim 1, whereby the clearance and/or creepage distance is ≥2.5 times the distance.

19. The galvanic separating apparatus according to claim 1, whereby the insulating layer is arranged in between and thereby insulates the winding layers from each other and protrudes beyond the winding layers.

20. The galvanic separating apparatus according to claim 1, whereby the insulating layer comprises an insulation plate which extends parallel to the printed circuit board on the upper side and perpendicular to the insulating layer, and is arranged within the bobbin between the pair of flanges and between the printed circuit board and the winding layers.

21. The galvanic separating apparatus according to claim 1, whereby the bobbin comprises a THT or SMT bobbin.

22. The galvanic separating apparatus according to claim 1, whereby the primary winding layer and/or the secondary winding layer comprises helical conductor paths and the helical conductor paths comprise a triple isolation according to IEC 60950.

23. The galvanic separating apparatus according to claim 1, whereby the insulating layer is arranged in between the winding layers with the primary insulated winding layer being on one side of the insulating layer and the secondary insulated winding layer being disposed on another side of the insulating layer, the insulating layer thereby insulating the winding layers from each other, and the insulating layer protruding beyond the winding layers on the upper side of the printed circuit board and extending through the recess to protrude on the lower side of the printed circuit board.

* * * * *

UNITED STATES PATENT AND TRADEMARK OFFICE
CERTIFICATE OF CORRECTION

PATENT NO. : 10,743,406 B2
APPLICATION NO. : 16/246722
DATED : August 11, 2020
INVENTOR(S) : Andrija Djurdjic et al.

Page 1 of 1

It is certified that error appears in the above-identified patent and that said Letters Patent is hereby corrected as shown below:

In the Claims

In Column 7, Line 50-51, Claim 11, delete "creepage distance is 1.5 times the distance" and insert --creepage distance is ≥ 1.5 times the distance--.

Signed and Sealed this
Sixth Day of October, 2020

Andrei Iancu
*Director of the United States Patent and Trademark Office*